United States Patent
Lozhkin

(10) Patent No.: US 9,692,463 B2
(45) Date of Patent: Jun. 27, 2017

(54) WIRELESS TRANSMISSION SYSTEM AND SIGNAL TRANSMISSION METHOD

(71) Applicant: FUJITSU LIMITED, Kawasaki-shi, Kanagawa (JP)

(72) Inventor: Alexander Nikolaevich Lozhkin, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/157,609

(22) Filed: May 18, 2016

(65) Prior Publication Data

US 2017/0012654 A1 Jan. 12, 2017

(30) Foreign Application Priority Data

Jul. 6, 2015 (JP) ................. 2015-135167

(51) Int. Cl.
| | |
|---|---|
| *H04B 1/38* | (2015.01) |
| *H04B 1/04* | (2006.01) |
| *H04L 12/64* | (2006.01) |
| *H04B 10/2575* | (2013.01) |
| *H04W 52/24* | (2009.01) |
| *H04W 88/08* | (2009.01) |
| *H04W 88/12* | (2009.01) |

(52) U.S. Cl.
CPC ....... *H04B 1/0475* (2013.01); *H04B 10/2575* (2013.01); *H04L 12/6418* (2013.01); *H04L 2012/6421* (2013.01); *H04W 52/243* (2013.01); *H04W 88/085* (2013.01); *H04W 88/12* (2013.01)

(58) Field of Classification Search
CPC .............. H04B 10/071; H04B 10/0775; H04B 10/2933; H04B 2210/078; H04B 10/2916; H04B 10/032; H04B 10/25133; H04B 10/64; H04B 10/0779; H04B 10/291; H04B 10/2931; H04B 10/505; H04B 10/5051; H04B 10/506; H04B 10/5161; H04B 10/541

USPC .......................................................... 455/92
See application file for complete search history.

(56) References Cited

U.S. PATENT DOCUMENTS

| | | | |
|---|---|---|---|
| 2005/0158057 A1* | 7/2005 | Tomofuji | H04B 10/0775 398/160 |
| 2012/0147938 A1* | 6/2012 | Schwager | H04B 3/54 375/222 |
| 2015/0125145 A1* | 5/2015 | Takeyama | H04B 3/46 398/34 |

FOREIGN PATENT DOCUMENTS

JP 2014-103571 6/2014

* cited by examiner

*Primary Examiner* — Ajibola Akinyemi
(74) *Attorney, Agent, or Firm* — Fujitsu Patent Center

(57) ABSTRACT

A wireless transmission system includes a first device and a second device that are connected by an optical transmission line. The first device includes: a generating unit that generates a transmission signal; and a first attenuation unit that attenuates the transmission signal generated by the generating unit and that inputs the transmission signal to the optical transmission line. The second device includes: a second attenuation unit that attenuates the transmission signal output from the optical transmission line; an amplifying unit that amplifies the transmission signal attenuated by the second attenuation unit; and a transmitting unit that wirelessly transmits the transmission signal amplified by the amplifying unit. The first device or the second device further includes a control unit that controls attenuation in each of the first attenuation unit and the second attenuation unit.

8 Claims, 8 Drawing Sheets

WIRELESS TRANSMISSION SYSTEM AND SIGNAL TRANSMISSION METHOD

CROSS-REFERENCE TO RELATED APPLICATION

This application is based upon and claims the benefit of priority of the prior Japanese Patent Application No. 2015-135167, filed on Jul. 6, 2015, the entire contents of which are incorporated herein by reference.

FIELD

The embodiments discussed herein are directed to a wireless transmission system and a signal transmission method.

BACKGROUND

In recent years, studies have been conducted on a system in which base station devices and wireless devices are connected by optical fibers by using a technology called, for example, Radio on Fiber (RoF). In RoF, wireless transmission signals are optically modulated by base station devices, are transmitted by optical fibers to wireless devices placed in remote site, are amplified by the wireless devices, and are then wirelessly transmitted. Accordingly, for example, it is possible to configure a system in which multiple wireless devices are connected to a single base station device, processes to be performed on signals are collectively performed by the base station device, and the signals are wirelessly transmitted from the respective wireless devices. Consequently, the overall cost of a wireless communication system can be reduced.

In general, when signals are sent by optical fibers in RoF, inter modulation distortion according to the frequency of the signals is generated. Namely, for a converter that converts, for example, electrical signals to optical signals, the range of electrical power in which signals can be converted while maintaining the linearity is relatively small and thus, if electrical signals outside this electrical power are converted to optical signals, inter modulation distortion is generated and thus the linearity of the signals is lost. Accordingly, there may be a case in which, after electrical power of a signal transmitted by an optical fiber is adjusted to a desired range, an electrical signal in which electrical power has been adjusted is converted to an optical signal and then this optical signal is transmitted by the optical fiber. Consequently, it is possible to decrease inter modulation distortion generated in the signal during the transmission performed by using the optical fiber and, as the result, it is possible to improve Spurious Free Dynamic Range (SFDR) that corresponds to a difference between the signal and the level of spurious.

Patent document 1: Japanese Laid-open Patent Publication No. 2014-103571

However, because noise generated in signals at the time of transmission performed by using optical fibers is not only due to inter modulation distortion, there is a problem in that an optimum signal to noise ratio (SNR) is not able to be obtained due to noise other than the inter modulation distortion. Specifically, in signal transmission using optical fibers, noise, such as thermal noise, shot noise of a photodiode, or relative intensity noise (RIN) of a light source. Unlike inter modulation distortion that is generated in a specific frequency band according to the frequency of a signal, these types of noise are added across a wide frequency band, resulting in a decrease in the SNR.

Due to such a decrease in the SNR, in a wireless communication system in which base station devices and wireless devices are connected by using optical fibers, the quality of transmission signals transmitted from, for example, a base station device to a wireless device may be degraded.

SUMMARY

According to an aspect of an embodiment, a wireless transmission system includes a first device and a second device that are connected by an optical transmission line. The first device includes: a generating unit that generates a transmission signal; and a first attenuation unit that attenuates the transmission signal generated by the generating unit and that inputs the transmission signal to the optical transmission line. The second device includes: a second attenuation unit that attenuates the transmission signal output from the optical transmission line; an amplifying unit that amplifies the transmission signal attenuated by the second attenuation unit; and a transmitting unit that wirelessly transmits the transmission signal amplified by the amplifying unit. The first device or the second device further includes a control unit that controls attenuation in each of the first attenuation unit and the second attenuation unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments of the present invention will be explained with reference to accompanying drawings. The present invention is not limited by the embodiments below.

[a] First Embodiment

Figure 1:
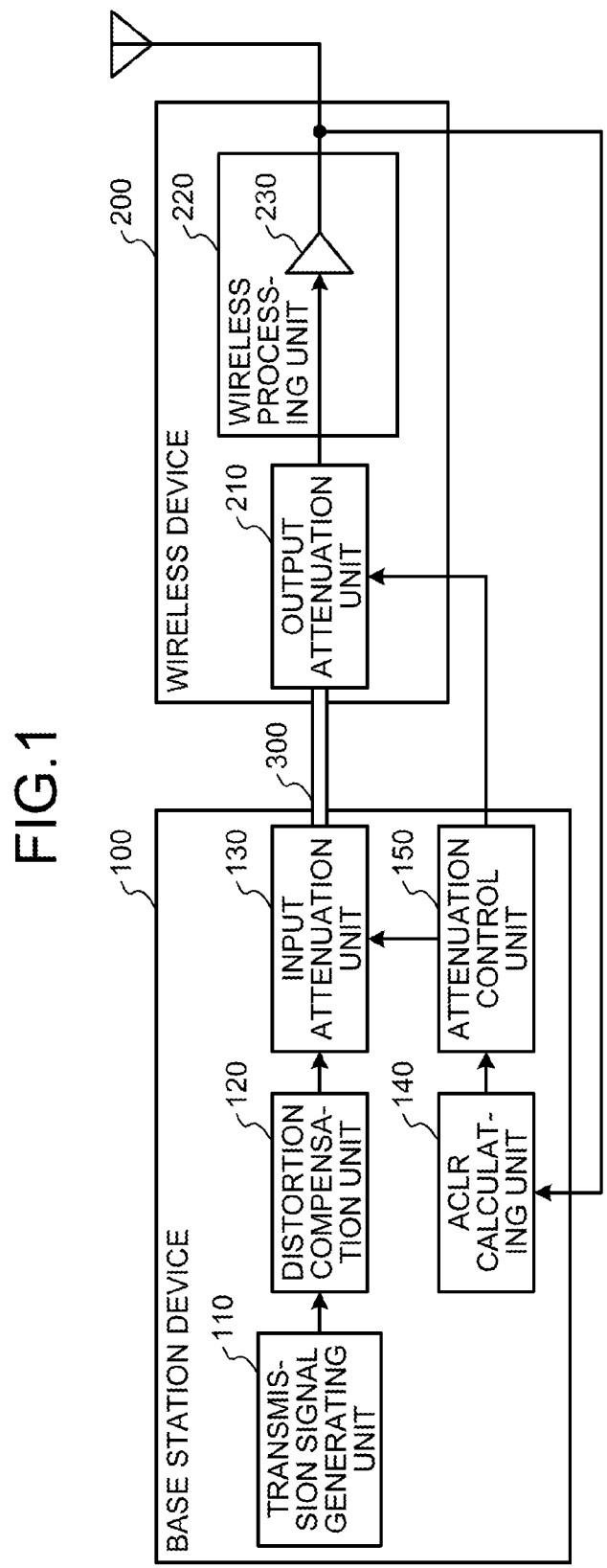
FIG. 1 is a block diagram illustrating the configuration of a wireless transmission system according to the first embodiment.

FIG. 1 is a block diagram illustrating the configuration of a wireless transmission system according to a first embodiment. This wireless transmission system has the configuration in which a base station device 100 and a wireless device 200 are connected by an optical transmission line 300. In FIG. 1, the single wireless device 200 is connected to the base station device 100; however, a plurality numbers of the wireless devices 200 may also be connected to the base station device 100.

The base station device 100 generates a transmission signal, performs distortion compensation on the generated transmission signal, and then transmits the signal to the wireless device 200 via the optical transmission line 300. At this time, the base station device 100 attenuates the transmission signal that has been subjected to the distortion compensation and then inputs the attenuated transmission signal to the optical transmission line 300. Specifically, the base station device 100 includes a transmission signal generating unit 110, a distortion compensation unit 120, an input attenuation unit 130, an adjacent channel leakage power ratio (ACLR) calculating unit 140, and an attenuation control unit 150.

The transmission signal generating unit 110 performs encoding, modulation, and the like on data and then generates a transmission signal. The transmission signal generated by the transmission signal generating unit 110 is an electrical signal.

The distortion compensation unit 120 performs distortion compensation on the transmission signal generated by the transmission signal generating unit 110. Specifically, the distortion compensation unit 120 adds, to the transmission signal, distortion that has the inverse characteristic of inter modulation generated in an amplifier that is provided in the wireless device 200. At this time, the distortion compensation unit 120 may also add distortion to the transmission signal by using, for example, a polynomial equation or may also read distortion according to the electrical power of the transmission signal from a look-up table and add the read distortion to the transmission signal.

The input attenuation unit 130 is provided at an input portion of the optical transmission line 300, attenuates the electrical power of the transmission signal that has been subjected to the distortion compensation, and inputs the transmission signal to the optical transmission line 300. At this time, the input attenuation unit 130 attenuates the electrical power of the transmission signal by the input time attenuation that is specified by the attenuation control unit 150. As will be described later, in an attenuation adjustment period, pieces of input time attenuation are sequentially changed, whereas, in a normal operation time period, input time attenuation that reduces various kinds of noise generated in the optical transmission line 300 is set in the input attenuation unit 130.

The ACLR calculating unit 140 feeds back the transmission signal amplified in the wireless device 200 and then calculates an ACLR on the basis of the feedback signal. Namely, for the signal that is wirelessly transmitted from the wireless device 200, the ACLR calculating unit 140 calculates the ratio of electrical power leaking outside a predetermined transmission bandwidth. Because the ACLR is the ratio of leakage power leaking to an adjacent channel, it is preferable to reduce the ACLR.

The attenuation control unit 150 sets an attenuation adjustment period at predetermined intervals and determines, on the basis of the ACLR during the adjustment period, optimum attenuation of a signal that is input to the optical transmission line 300 and optimum attenuation of a signal that is output from the optical transmission line 300. Namely, the attenuation control unit 150 determines, during the adjustment period, input time attenuation and output time attenuation that minimize the ACLR. Then, the attenuation control unit 150 sets, in a normal operation time period, the determined optimum input time attenuation and the determined optimum output time attenuation in the input attenuation unit 130 and an output attenuation unit 210 in the wireless device 200, respectively. The configuration and the operation of the attenuation control unit 150 in detail will be described later.

The transmission signal generating unit 110, the distortion compensation unit 120, the ACLR calculating unit 140, and the attenuation control unit 150 can be configured to use, for example, a processor, such as a central processing unit (CPU), a field programmable gate array (FPGA), a digital signal processor (DSP), or the like and a memory, such as a random access memory (RAM), a read only memory (ROM), or the like. Furthermore, the input attenuation unit 130 can be configured to use an attenuator.

The wireless device 200 attenuates the transmission signal transmitted by the optical transmission line 300, amplifies the attenuated transmission signal, and wirelessly transmits the amplified transmission signal. Specifically, the wireless device 200 includes the output attenuation unit 210 and a wireless processing unit 220.

The output attenuation unit 210 is provided at an output portion of the optical transmission line 300, attenuates the electrical power of the transmission signal output from the optical transmission line 300, and outputs the transmission signal to the wireless processing unit 220. At this time, the output attenuation unit 210 attenuates the electrical power of the transmission signal by the output time attenuation that is specified by the attenuation control unit 150. As will be described later, in an attenuation adjustment period, pieces of output time attenuation are sequentially changed, whereas, in a normal operation time period, output time attenuation that reduces various kinds of noise generated in the optical transmission line 300 is set in the output attenuation unit 210. The output attenuation unit 210 can be configured to use an attenuator.

The wireless processing unit 220 includes an amplifier 230 and performs a predetermined wireless transmission process on the transmission signal that is output from the output attenuation unit 210. Specifically, the wireless processing unit 220 performs a wireless transmission process, such as digital/analogue (D/A) conversion, up-conversion, or the like. Then, the wireless processing unit 220 amplifies, by using the amplifier 230, the signal that has been subjected to the wireless transmission process and then wirelessly transmits the amplified signal via an antenna.

The optical transmission line 300 has optical fibers, performs optical modulation on the transmission signal that is input from the input attenuation unit 130, converts the transmission signal to an optical signal, and transmits the obtained optical signal to the wireless device 200 by using the optical fibers. Then, the optical transmission line 300 performs optical modulation on the optical signal that was transmitted to the wireless device 200, converts the optical signal to an electrical signal, and outputs the obtained electrical signal to the output attenuation unit 210. In the course of the transmission performed by the optical transmission line 300, inter modulation distortion and noise are generated in the transmission signal; however, in the first embodiment, the inter modulation distortion and the noise can be suppressed by the attenuation performed by the input attenuation unit 130 and the output attenuation unit 210 and thus favorable SFDR and SNR can be obtained.

Figure 2:
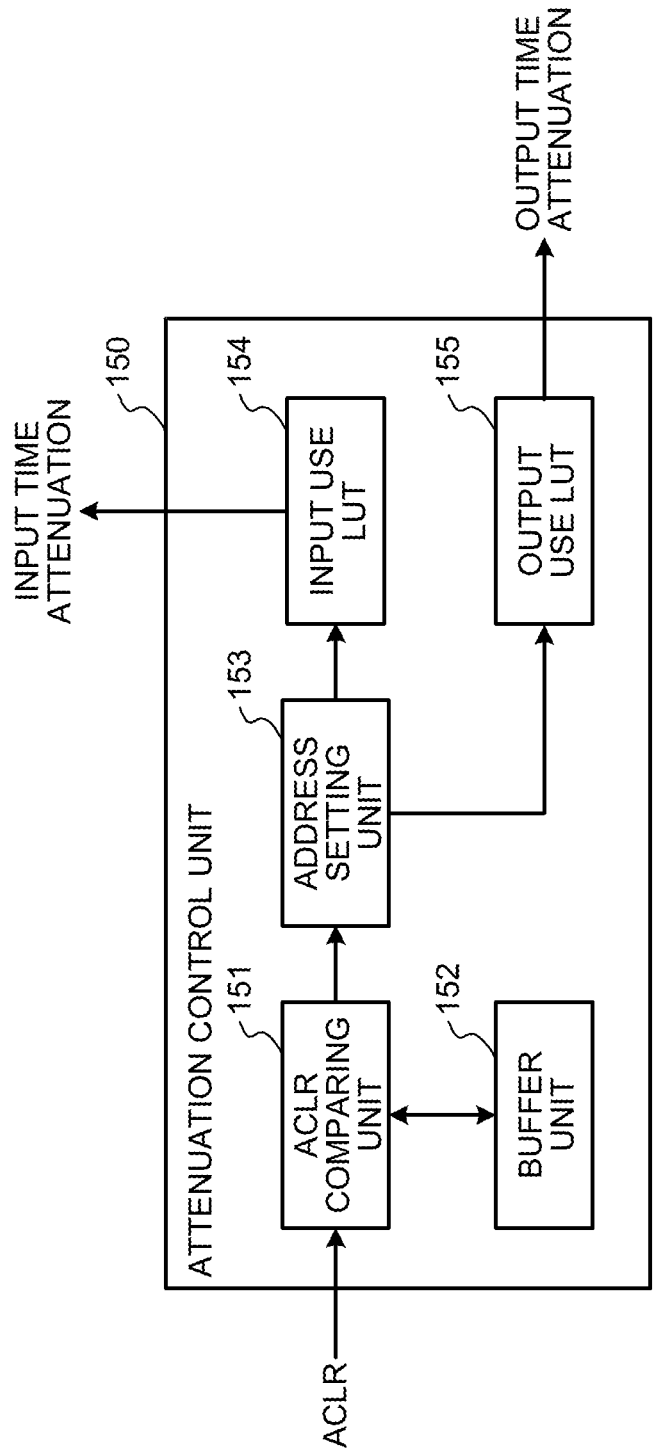
FIG. 2 is a block diagram illustrating the configuration of an attenuation control unit according to the first embodiment.

In the following, the configuration of the attenuation control unit 150 will be described with reference to FIG. 2. FIG. 2 is a block diagram illustrating the configuration of the attenuation control unit 150. The attenuation control unit 150 illustrated in FIG. 2 includes an ACLR comparing unit 151, a buffer unit 152, an address setting unit 153, an input use look-up table (hereinafter, simply referred to as an "input use LUT") 154, and an output look-up table (hereinafter, simply referred to as an "output use LUT") 155.

The ACLR comparing unit 151 compares, in an adjustment period that is used to determine an optimum attenuation, ACLRs obtained when the input time attenuation and the output time attenuation are changed. Specifically, the ACLR comparing unit 151 stores, in the buffer unit 152, the ACLRs that are calculated by the ACLR calculating unit 140 and in which certain input time attenuation and output time attenuation are set. Then, if the input time attenuation and the output time attenuation are changed, the ACLR comparing unit 151 compares the ACLRs that are calculated by the ACLR calculating unit 140 after these pieces of attenuation are changed with the ACLRs that are stored in the buffer unit 152. Furthermore, the ACLR comparing unit 151 stores, in the buffer unit 152, a smaller ACLR that is obtained as the result of the comparison.

Namely, when the pieces of the input time attenuation and the pieces of the output time attenuation are sequentially changed, the ACLR comparing unit 151 compares the minimum value of the ACLR that has not been changed this time with the ACLR that has been changed this time and then changes, as needed, the minimum value of the ACLR that is to be stored in the buffer unit 152. Then, the ACLR comparing unit 151 notifies the address setting unit 153 of the comparison result.

The buffer unit 152 stores, if the pieces of the input time attenuation and the pieces of the output time attenuation are sequentially changed in the adjustment period, on the basis of the comparison result obtained by the ACLR comparing unit 151, the minimum value of the ACLR obtained up to this time of change.

The address setting unit 153 specifies, in the adjustment period that is used to determine an optimum attenuation, an address in each of the input use LUT 154 and the output use LUT 155 is specified every time comparison between ACLRs has been completed by the ACLR comparing unit 151. Namely, every time the comparison between the ACLRs has been completed, the address setting unit 153 specifies an address that is not specified in the input use LUT 154 and the output use LUT 155, thereby changing the input time attenuation and the output time attenuation. Furthermore, if specifying of all of the addresses in the input use LUT 154 and the output use LUT 155 has been completed, the address setting unit 153 sets an address associated with the minimum value of the ACLR in the input use LUT 154 and the output use LUT 155. Namely, if the adjustment period has been ended and a normal operation time period is started, the address setting unit 153 sets addresses to the look-up tables such that the input time attenuation and the output time attenuation that minimize the ACLR are output from the input use LUT 154 and the output use LUT 155, respectively.

The input use LUT 154 holds different pieces of input time attenuation in an associated manner with a plurality of addresses. The output use LUT 155 holds different pieces of output time attenuation by associating the different pieces of output time attenuation with a plurality of addresses. Here, each of the sum totals of the pieces of attenuation held by being associated with the addresses in the input use LUT 154 and the output use LUT 155 are the fixed value. Namely, the total value of the input time attenuation and the output time attenuation held by the associated address specified by the address setting unit 153 is the fixed value. Accordingly, for example, the input use LUT 154 and the output use LUT 155 each have a plurality of the same addresses and each of the sum totals of the pieces of the input time attenuation and the pieces of the output time attenuation held by the same addresses is equal to the fixed value. This fixed value is a value determined on the basis of the electrical power of a transmission signal that can be output from the distortion compensation unit 120 and the electrical power of a transmission signal that can be input to the amplifier 230.

Figure 3:
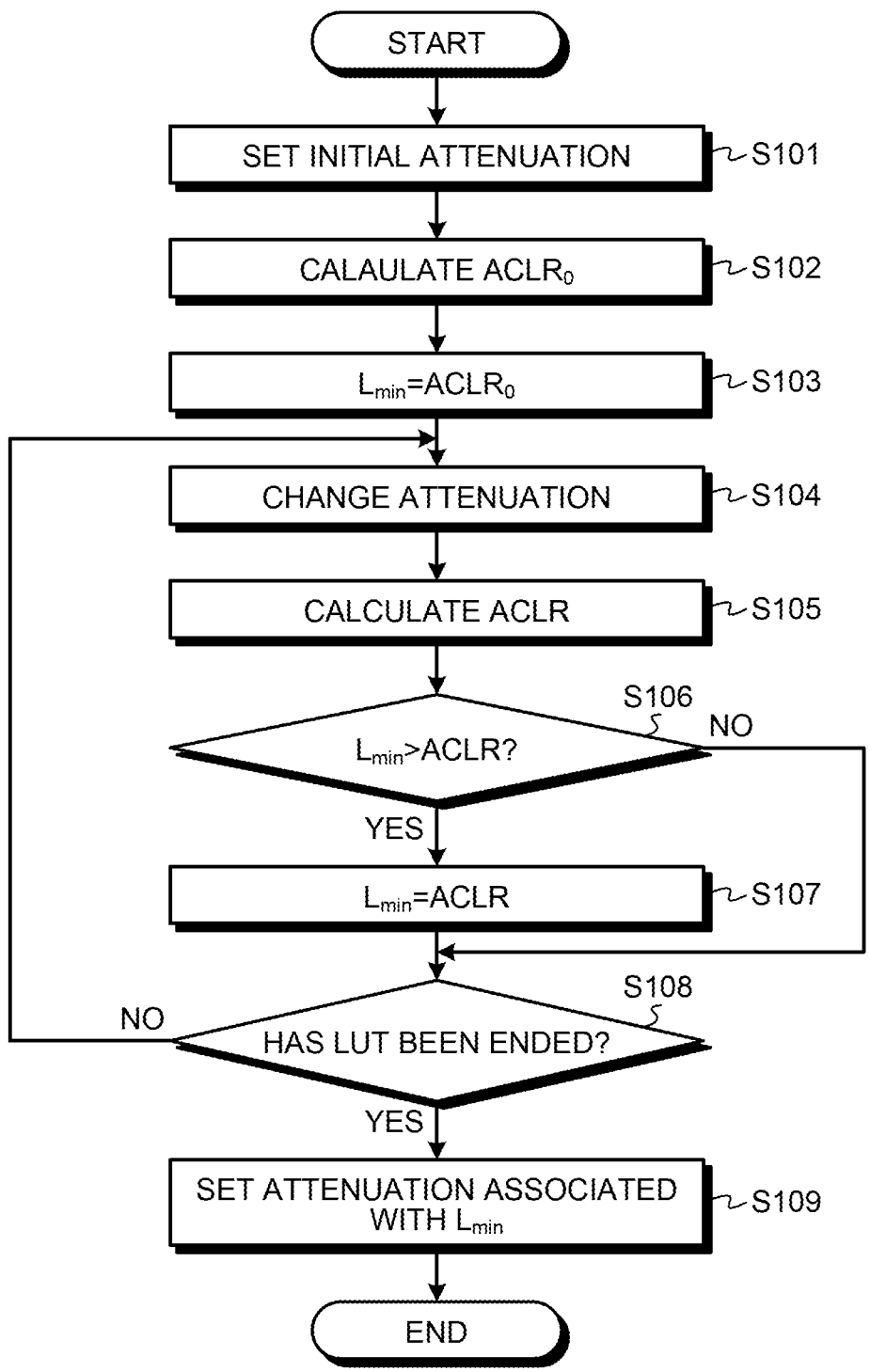
FIG. 3 is a flowchart illustrating an attenuation determination process according to the first embodiment.

In the following, an attenuation determination process performed by the attenuation control unit 150 configured as described above will be described with reference to the flowchart illustrated in FIG. 3. The attenuation determination process described below is performed in an adjustment period that reaches at predetermined intervals and, during a normal operation time period, attenuation determined by the attenuation determination process is set in the input attenuation unit 130 and the output attenuation unit 210.

If time reaches the adjustment period, an initial address of each of the input use LUT 154 and the output use LUT 155 is specified by the address setting unit 153. Then, the input time attenuation that is associated with the initial address is set in the input attenuation unit 130 by the input use LUT 154 and the output time attenuation that is associated with the initial address is set in the output attenuation unit 210 by the output use LUT 155 (Step S101). The sum total of the input time attenuation and the output time attenuation associated with the initial address is equal to the fixed value described above.

If the input time attenuation and the output time attenuation associated with the initial address are set in the input attenuation unit 130 and the output attenuation unit 210, respectively, the transmission signal generated by the transmission signal generating unit 110 is subjected to distortion compensation performed by the distortion compensation unit 120 and is then attenuated by the input attenuation unit 130. Namely, electrical power of a transmission signal is attenuated by the input time attenuation that is associated with the initial address. Then, the attenuated transmission signal is input to the optical transmission line 300, is transmitted as an optical signal to the wireless device 200, is returned to an electrical signal, and is then output to the output attenuation unit 210.

Because output time attenuation that is associated with the initial address has been set in the output attenuation unit 210, electrical power of a transmission signal is attenuated by this output attenuation. Then, the transmission signal is subjected to a wireless process by the wireless processing unit 220 and is then amplified by the amplifier 230. The amplified transmission signal is wirelessly transmitted from an antenna and is fed back to the base station device 100. Then, the feedback signal is input to the ACLR calculating unit 140. Furthermore, an $ACLR_0$ in a state in which the input time attenuation and the output time attenuation associated with the initial address are set is calculated from the feedback signal by the ACLR calculating unit 140 (Step S102).

The calculated $ACLR_0$ is output to the attenuation control unit 150 and is stored as the minimum value $L_{min}$ of the ACLR in the buffer unit 152 by the ACLR comparing unit 151 in the attenuation control unit 150 (Step S103). Namely, the $ACLR_0$ in the initial state is temporarily stored as the minimum value $L_{min}$ of the ACLR in the buffer unit 152.

If the minimum value $L_{min}$ is stored in the buffer unit 152, an address to be specified is changed by the address setting unit 153. Namely, addresses that are other than the initial address in the input use LUT 154 and the output use LUT 155 and that have not been specified are specified by the address setting unit 153. Then, the input time attenuation that is associated with the specified address is set in the input attenuation unit 130 by the input use LUT 154 and the output time attenuation that is associated with the specified address is set in the output attenuation unit 210 by the output use LUT 155 (Step S104). Furthermore, the sum total of the input time attenuation and the output time attenuation associated with the address specified here is also equal to the fixed value described above.

Then, similarly to the case in which the input time attenuation and the output time attenuation associated with the initial address are set, the transmission signal is attenuated at each of the time of input to and output from the optical transmission line 300, is amplified by the amplifier 230, and is wirelessly transmitted from the antenna. Furthermore, the signal that is output from the amplifier 230 is fed back to the ACLR calculating unit 140 in the base station device 100 and then an ACLR is calculated (Step S105).

The calculated ACLR is output to the attenuation control unit 150 and is compared, by the ACLR comparing unit 151 in the attenuation control unit 150, with the minimum value $L_{min}$ of the ACLR retained in the buffer unit 152 (Step S106). Namely, in this case, the magnitude of the $ACLR_0$ that is stored in the buffer unit 152 and that is in an initial state is compared with that of the ACLR that is calculated this time.

If the comparison result indicates that the ACLR calculated this time is smaller (Yes at Step S106), this ACLR is stored as the minimum value $L_{min}$ in the buffer unit 152 (Step S107). Namely, the minimum value $L_{min}$ of the temporary ACLR that is to be used until a change of the attenuation obtained this time is stored in the buffer unit 152. In contrast, if the minimum value $L_{min}$ stored in the buffer unit 152 is equal to or less than the ACLR that is calculated this time (No at Step S106), the minimum value $L_{min}$ stored in the buffer unit 152 is not updated.

If the comparison performed by the ACLR comparing unit 151 has been completed, the address setting unit 153 determines whether specifying of all of the addresses in the input use LUT 154 and the output use LUT 155 has been completed (Step S108). If the determination result indicates that unspecified addresses are present (No at Step S108), the unspecified addresses are continuously specified, the input time attenuation and the output time attenuation are changed, and the minimum value $L_{min}$ of an ACLR is repeatedly updated (Step S104 to S107).

Furthermore, if specifying of all of the addresses in the input use LUT 154 and the output use LUT 155 has been ended (Yes at Step S108), this indicates that the minimum value $L_{min}$ stored in the buffer unit 152 is the minimum value of the ACLR when attenuation is changed. Thus, the address that is associated with the minimum value $L_{min}$ stored in the buffer unit 152 is notified to the input use LUT 154 and the output use LUT 155 by the address setting unit 153 and then the pieces of attenuation that are associated with the notified address are set in the input attenuation unit 130 and the output attenuation unit 210, respectively (Step S109). Consequently, the input time attenuation and the output time attenuation that minimize the ACLR are set and the adjustment period is ended and changed to the normal operation time period.

In the normal operation time period, because the input time attenuation and the output time attenuation that minimize the ACLR are set in the input attenuation unit 130 and the output attenuation unit 210, respectively, electrical power of a transmission signal outside the bandwidth is small. This means that inter modulation distortion and noise that are added outside the bandwidth of the transmission signal due to the transmission performed by using the optical transmission line 300 is small and means that the degradation of the SFDR and the SNR of the transmission signal is suppressed to the minimum. More specifically, because the transmission signal is attenuated by the input attenuation unit 130, consequently, the electrical power of the transmission signal becomes electrical power that can maintain the linearity at the time of optical modulation performed in the optical transmission line 300 and thus the inter modulation distortion generated in a specific frequency band is suppressed. Furthermore, because the transmission signal is attenuated by the output attenuation unit 210, consequently, thermal noise, shot noise, and relative intensity noise (RIN) generated across the wide frequency band other than the frequency of the transmission signal are suppressed.

As described above, by determining input time attenuation and output time attenuation that minimize electrical power leaking outside the bandwidth of the transmission signal and by attenuating the transmission signal at the time of input to and output from the optical transmission line 300, the degradation of the quality of the transmission signal can be suppressed. In particular, because the transmission signal is also attenuated at the time of output from the optical transmission line 300, the noise generated across the wide bandwidth can be suppressed regardless of the frequency of the transmission signal. Consequently, it is possible to improve not only an SFDR but also an SNR of the transmission signal.

Figure 4:
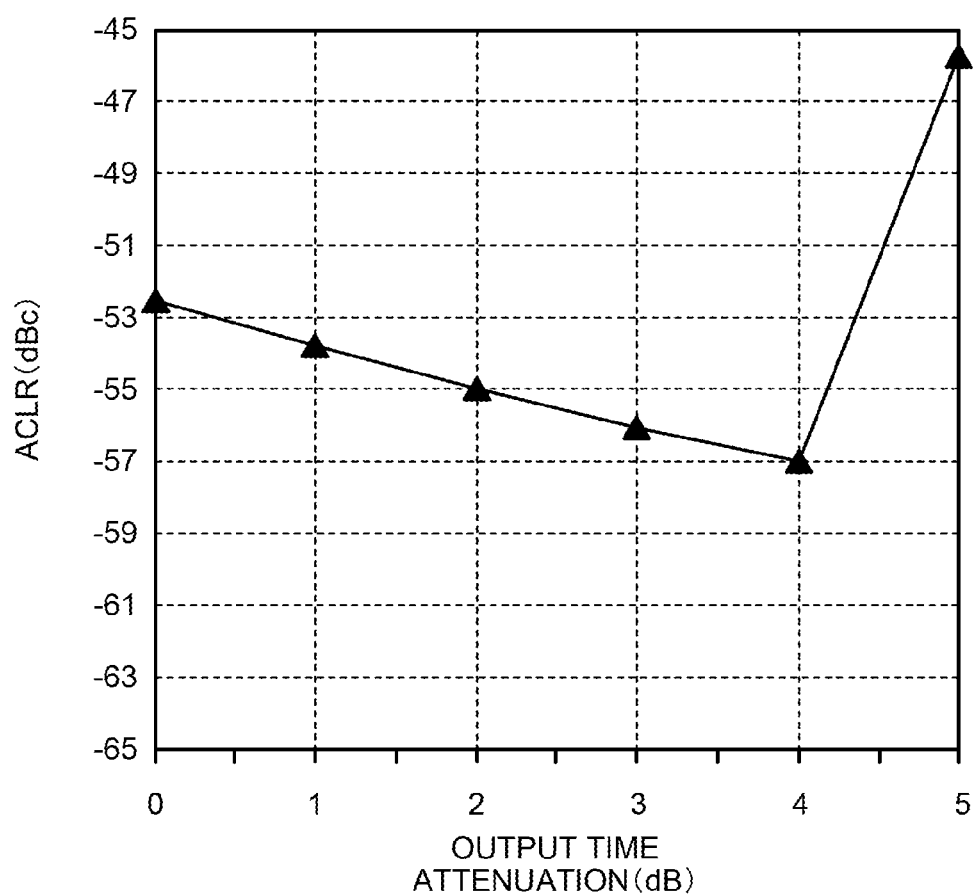
FIG. 4 is a schematic diagram illustrating a specific example of the association relationship between attenuation and the ACLR.

FIG. 4 is a schematic diagram illustrating a specific example of the association relationship between the output time attenuation and the ACLR. As illustrated in FIG. 4, if the output time attenuation is changed, the ACLR is also changed and, when the output time attenuation is 4 dB, the ACLR is the minimum. Namely, if a transmission signal that is output from the optical transmission line 300 is not attenuated, the ACLR is about −53 dBc, whereas, if the transmission signal that is output from the optical transmission line 300 is attenuated by 4 dB, the ACLR is about −57 dBc. This is conceivable that thermal noise, shot noise, and RIN generated in the optical transmission line 300 are suppressed by the output attenuation unit 210 and, consequently, leakage power outside the bandwidth of the transmission signal is decreased. Furthermore, because the leakage power outside the bandwidth of the transmission signal is decreased, an SNR of a transmission signal is improved.

As described above, according to the first embodiment, the attenuation unit that attenuates a transmission signal is provided at each of the input portion and the output portion of the optical transmission line and the input time attenuation and the output time attenuation that minimize an ACLR are determined in the adjustment period. Then, the determined input time attenuation and the output time attenuation are set in the respective attenuation units and the transmission signal is attenuated. Consequently, the generation of inter modulation distortion in the optical transmission line can be suppressed and, at the same time, thermal noise, shot noise, and a RIN generated in the optical transmission line can be suppressed, which makes it possible to suppress degradation of the quality of signals even if the signals are transmitted by using optical fibers.

[b] Second Embodiment

The characteristic of a second embodiment is that input time attenuation and output time attenuation are determined in accordance with an average electrical power of a transmission signal and the transmission signals are attenuated.

Figure 5:
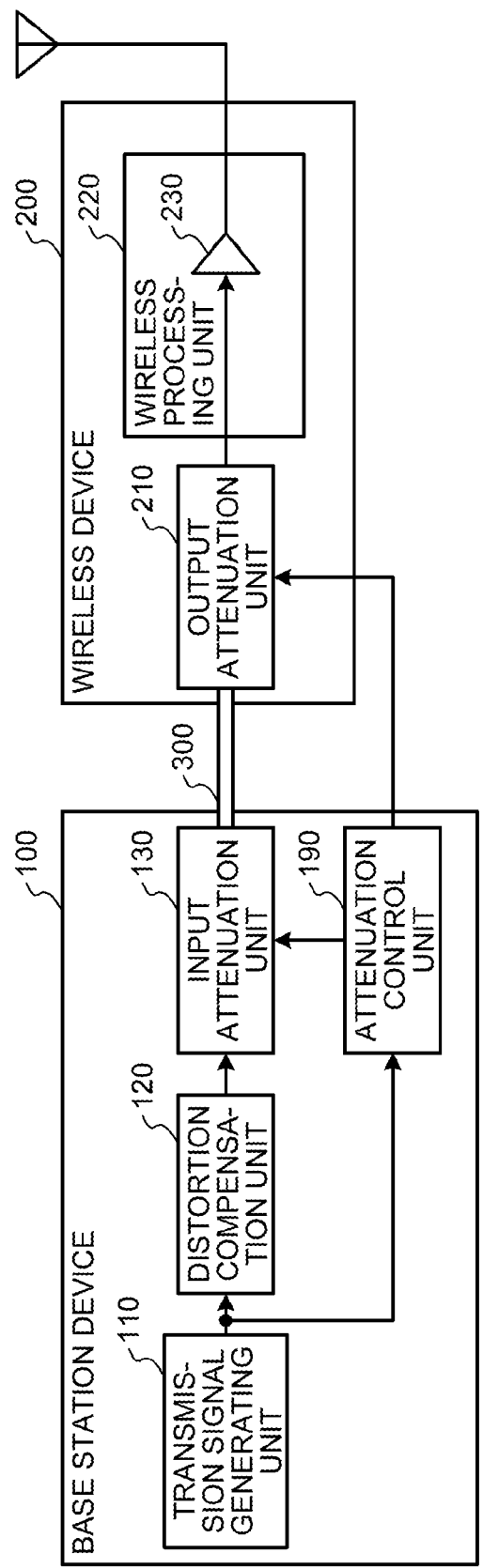
FIG. 5 is a block diagram illustrating the configuration of a wireless transmission system according to a second embodiment.

FIG. 5 is a block diagram illustrating the configuration of a wireless transmission system according to the second embodiment. In FIG. 5, components having the same configuration as those illustrated in FIG. 1 are assigned the same reference numerals and descriptions thereof will be omitted. The wireless transmission system illustrated in FIG. 5 includes an attenuation control unit 190 instead of the ACLR calculating unit 140 and the attenuation control unit 150 in the wireless transmission system illustrated in FIG. 1.

The attenuation control unit 190 calculates an average electrical power from signal electrical power of a transmission signal and sets the input time attenuation and the output time attenuation according to the average electrical power in the input attenuation unit 130 and the output attenuation unit 210, respectively, in the wireless device 200. The ACLR obtained at the time of output from the amplifier 230 is almost determined by the signal electrical power of a transmission signal. Consequently, the input time attenuation and the output time attenuation that minimize the ACLR can be previously stored for each piece of signal electrical power of a transmission signal. Furthermore, the attenuation control unit 190 can determine optimum input time attenuation and output time attenuation that are stored in an associated manner with the average electrical power of the transmission signal.

Figure 6:
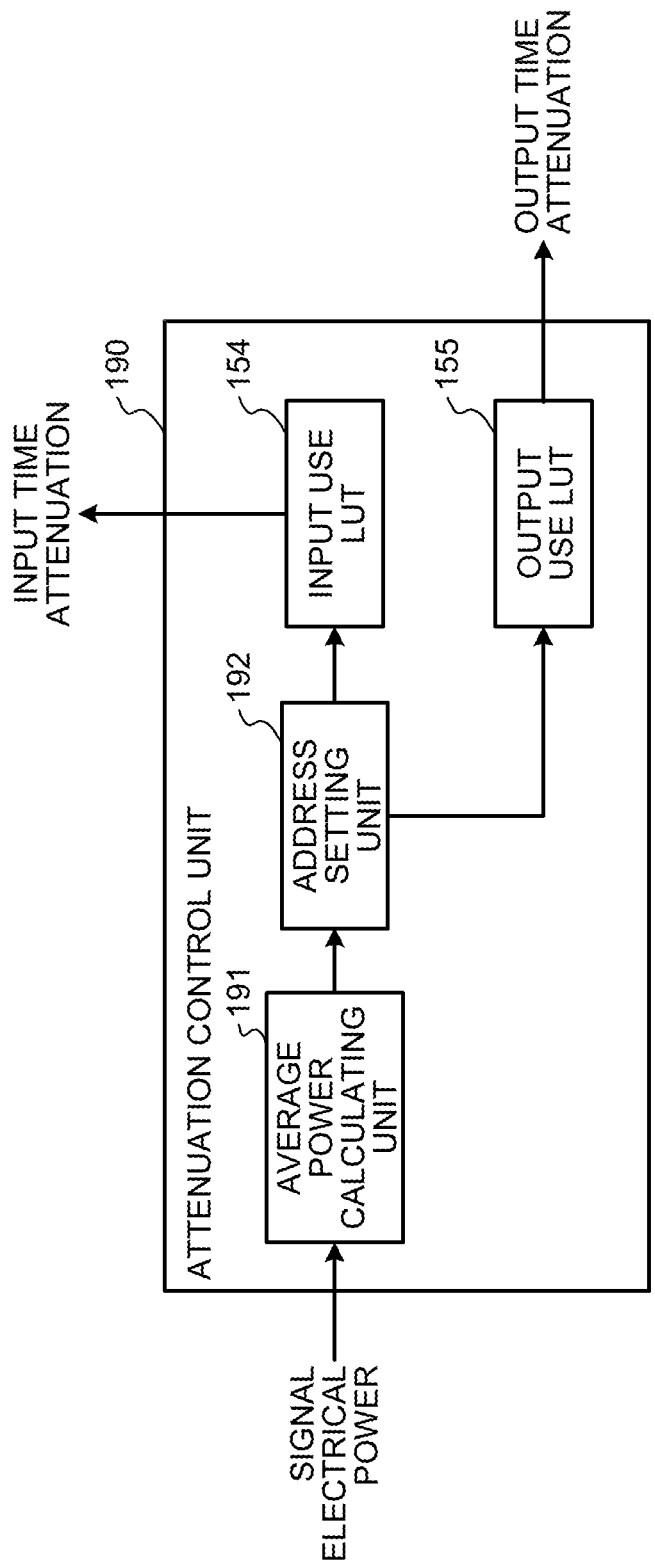
FIG. 6 is a block diagram illustrating the configuration of an attenuation control unit according to the second embodiment.

FIG. 6 is a block diagram illustrating the configuration of the attenuation control unit 190. In FIG. 6, components having the same configuration as those illustrated in FIG. 2 are assigned the same reference numerals and descriptions thereof will be omitted. The attenuation control unit 190 illustrated in FIG. 6 includes an average power calculating unit 191 and an address setting unit 192, instead of the ACLR comparing unit 151, the buffer unit 152, and the address setting unit 153 in the attenuation control unit 150 illustrated in FIG. 2.

The average power calculating unit 191 acquires signal electrical power of the transmission signal generated in the transmission signal generating unit 110 and calculates an average electrical power of the signal electrical power in a predetermined time period.

The address setting unit 192 sets addresses in each of the look-up tables such that the input time attenuation and the output time attenuation that are associated with the average electrical power are output from the input use LUT 154 and the output use LUT 155 by the average power calculating unit 191.

In the second embodiment, because optimum input time attenuation and output time attenuation are determined from the average electrical power of a transmission signal, there is no need to determine optimum input time attenuation and output time attenuation by setting an adjustment period of the attenuation. Namely, there is no need to calculate or compare ACLRs on the basis of feedback signals by sequentially changing pieces of attenuation. Consequently, attenuation can be determined with a simple circuit configuration and by an easy process.

As described above, according to the second embodiment, the attenuation unit that attenuates a transmission signal is provided at each of the input portion and the output portion of the optical transmission line, the input time attenuation and the output time attenuation that are previously stored according to the average electrical power of the transmission signal are set in the respective attenuation units, and the transmission signals are attenuated. Consequently, it is possible to suppress degradation of the quality of signals with a simple circuit configuration and by an easy process even if the signals are transmitted by using optical fibers.

[c] Third Embodiment

The characteristic of a third embodiment is that a feedback signal that is fed back for distortion compensation via the optical transmission line is attenuated at the input portion and the output portion of the optical transmission line.

Figure 7:
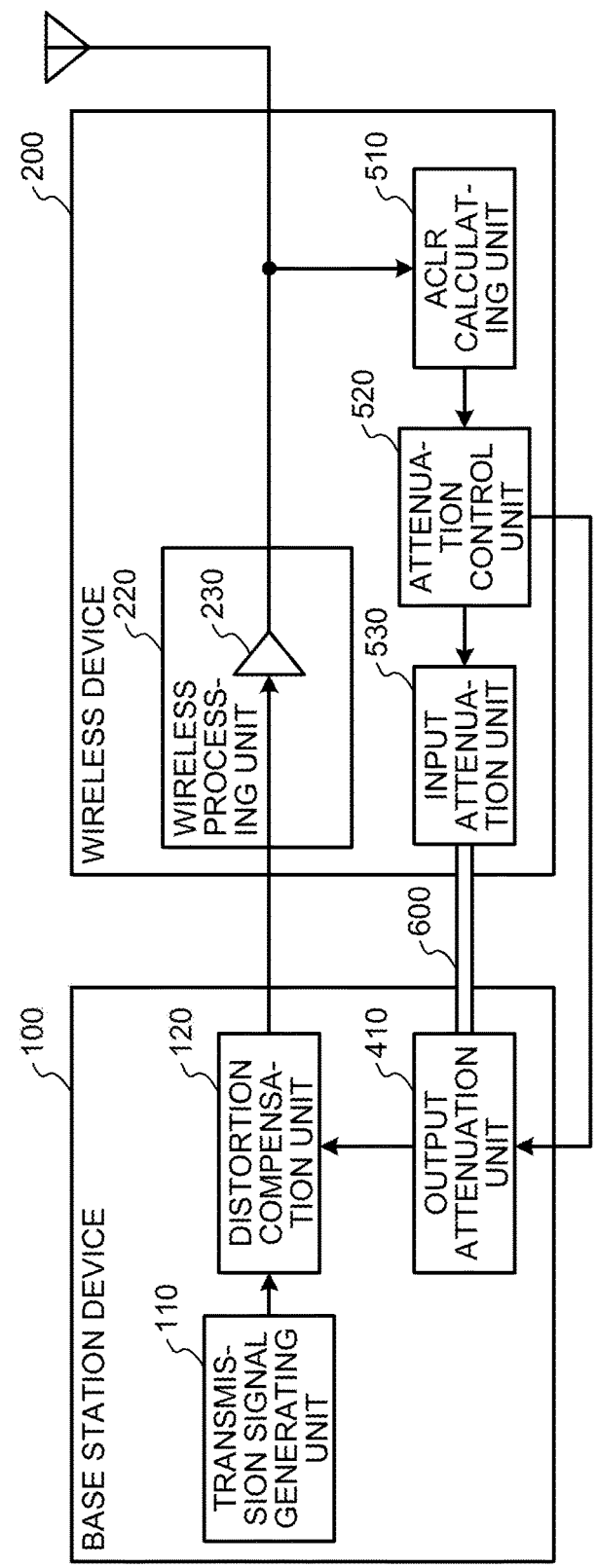
FIG. 7 is a block diagram illustrating the configuration of a wireless transmission system according to a third embodiment.

FIG. 7 is a block diagram illustrating the configuration of a wireless transmission system according to the third embodiment. In FIG. 7, components having the same configuration as those illustrated in FIG. 1 are assigned the same reference numerals and descriptions thereof will be omitted. In the wireless transmission system illustrated in FIG. 7, the base station device 100 and the wireless device 200 are connected by an optical transmission line 600. Furthermore, the base station device 100 includes the transmission signal generating unit 110, the distortion compensation unit 120, and an output attenuation unit 410. Furthermore, the wireless device 200 includes the wireless processing unit 220, an ACLR calculating unit 510, an attenuation control unit 520, and an input attenuation unit 530.

The output attenuation unit 410 is provided at the output portion of the optical transmission line 600, attenuates the electrical power of the feedback signal that is output from the optical transmission line 600, and outputs the signal to the distortion compensation unit 120. At this time, the output attenuation unit 410 attenuates the electrical power of the feedback signal by the output time attenuation that is specified by the attenuation control unit 520. During the adjustment period of the attenuation, pieces of output time attenuation are sequentially changed, whereas, during the normal operation time period, output time attenuation that suppresses various kinds of noise generated in the optical transmission line 600 is set in the output attenuation unit 410.

The ACLR calculating unit 510 feeds back the transmission signal that was amplified by the amplifier 230 and calculates an ACLR on the basis of the feedback signal. Namely, for the signal that is wirelessly transmitted from the wireless device 200, the ACLR calculating unit 510 calculates the ratio of the electrical power leaking outside the predetermined transmission bandwidth.

The attenuation control unit 520 sets an adjustment period of attenuation at predetermined intervals and determines, on the basis of the ACLR during the adjustment period, optimum attenuation of the signal that is input to the optical transmission line 600 and optimum attenuation of the signal that is output from the optical transmission line 600. Namely, the attenuation control unit 520 determines input time attenuation and output time attenuation that minimize the ACLR during the adjustment period. Then, in the normal operation time period, the attenuation control unit 520 sets the optimum input time attenuation and output time attenuation in the input attenuation unit 530 and the output attenuation unit 410 in the base station device 100, respectively. Furthermore, the internal configuration of the attenuation control unit 520 is the same as that of the attenuation control unit 150 (FIG. 2) described in the first embodiment.

The input attenuation unit 530 is provided at the input portion of the optical transmission line 600, attenuates the electrical power of a feedback signal, and inputs the signal to the optical transmission line 600. At this time, the input attenuation unit 530 attenuates the electrical power of the feedback signal by the input time attenuation that is specified by the attenuation control unit 520. In the adjustment period of the attenuation, pieces of input time attenuation are sequentially changed, whereas, in the normal operation time period, input time attenuation that suppresses various kinds of noise generated in the optical transmission line 600 is set in the input attenuation unit 530.

The optical transmission line 600 includes optical fibers, performs optical modulation on the feedback signal that is input from the input attenuation unit 530, converts the feedback signal to an optical signal, and transmits the obtained optical signal to the base station device 100 by using an optical fiber. Then, the optical transmission line 600 performs optical demodulation on the optical signal that was transmitted to the base station device 100, converts the optical signal to an electrical signal, and outputs the obtained electrical signal to the output attenuation unit 410. In the course of transmission performed by the optical transmission line 600, inter modulation distortion and noise are generated in the feedback signal; however, in the third embodiment, the inter modulation distortion and the noise can be suppressed by attenuation performed by the input attenuation unit 530 and the output attenuation unit 410 and thus favorable SFDR and SNR can be obtained.

In the third embodiment, similarly to the first embodiment, in the attenuation adjustment period, attenuation that minimizes an ACLR is determined. Namely, while pieces of input time attenuation and output time attenuation are sequentially changed by the attenuation control unit 520, the input time attenuation and output time attenuation that minimize an ACLR that is calculated by the ACLR calculating unit 510 is determined. A specific attenuation determination process is the same as that described in the first embodiment.

In the normal operation time period, the feedback signal from the wireless device 200 to the base station device 100 is transmitted by the optical transmission line 600. At this time, the input time attenuation and the output time attenuation that are determined in the adjustment period are set in the input attenuation unit 530 and the output attenuation unit 410, respectively, and the feedback signal is attenuated at the time on an input to and an output from the optical transmission line 600. The attenuated feedback signal is input to the distortion compensation unit 120.

The distortion compensation unit 120 updates, by using the feedback signal, a coefficient of a polynomial equation for, for example, distortion compensation or updates, by using the feedback signal, a look-up table. At this time, because the inter modulation distortion and the noise of the feedback signal is suppressed due to the attenuation in the input attenuation unit 530 and the output attenuation unit 410, the SFDR and the SNR of the feedback signal that is input to the distortion compensation unit 120 is favorable. Consequently, the accuracy of the update of the coefficient and the look-up table performed by the distortion compensation unit 120 is improved and thus the accuracy of the distortion compensation is also improved.

Figure 8:
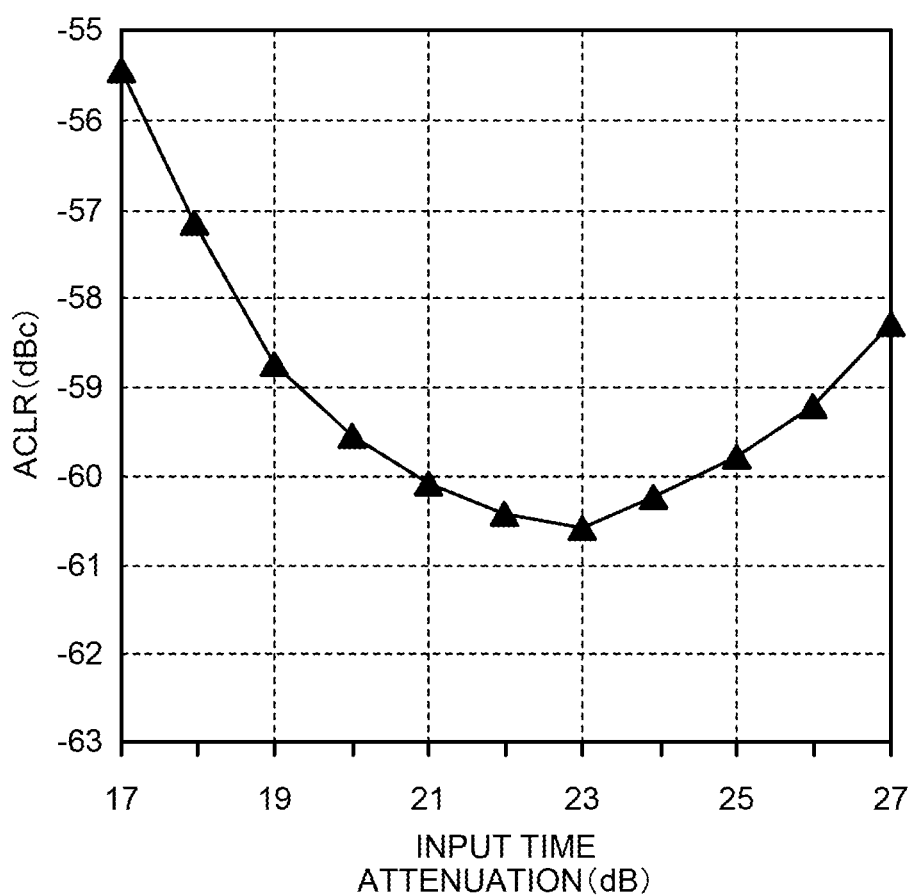
FIG. 8 is a schematic diagram illustrating a specific example of the association relationship between attenuation and the ACLR.

FIG. 8 is a schematic diagram illustrating a specific example of the association relationship between the input time attenuation and the ACLR. As illustrated in FIG. 8, if the input time attenuation is changed, the ACLR is also changed and, when the input time attenuation is 23 dB, the ACLR is the minimum. In this way, when the feedback signal is fed back via the optical transmission line 600, optimum attenuation that minimizes the ACLR is also present. Thus, in the third embodiment, during the adjustment period, the optimum attenuation that minimizes the ACLR at the time of output from the amplifier 230 is determined and, in the normal operation time period, the feedback signal is attenuated at the time of an input to and an output from the optical transmission line 600. Consequently, in the normal operation time period, the ACLR of the transmission signal is the minimum and thus the SFDR and the SNR can be improved.

As described above, according to the third embodiment, the attenuation unit that attenuates the feedback signal is provided at each of the input portion and the output portion of the optical transmission line and both the input time attenuation and the output time attenuation that minimize the ACLR are determined in the adjustment period. Then, the determined input time attenuation and output time attenuation are set in the respective attenuation units and the feedback signal is attenuated. Consequently, the generation of the inter modulation distortion in the optical transmission line can be suppressed and, at the same time, thermal noise, shot noise, and the RIN generated in the optical transmission line can be suppressed, which makes it possible to suppress degradation of the quality of signals even if the signals are transmitted by using optical fibers. Furthermore, because the degradation of the quality of signals can be suppressed, the accuracy of distortion compensation can be consequently improved and thus the quality of the transmission signal can be improved.

Furthermore, in each of the embodiments described above, the attenuation control unit that determines attenuation may also be provided in either of the base station device 100 or the wireless device 200. Namely, for example, in the first and the second embodiments, the attenuation control units 150 and 190 may also be provided in the wireless device 200 and, in the third embodiment, the attenuation control unit 520 may also be provided in the base station device 100. Furthermore, in the third embodiment described above, both the input time attenuation and the output time attenuation that minimize the ACLR are determined in the adjustment period and then the feedback signal is attenuated; however, determination of the attenuation may also be performed by using the same method described in the second embodiment. Namely, the average electrical power of the feedback signal is calculated, the input time attenuation and the output time attenuation that are previously stored in accordance with the average electrical power of the feedback signal may also be set in the respective attenuation units and the feedback signal may also be attenuated.

Furthermore, the embodiments described above can be appropriately used in combination. Namely, for example, the base station device 100 and the wireless device 200 are connected by the optical transmission line 300 and the optical transmission line 600 and both the transmission signal and the feedback signal may also be transmitted via optical fibers. In this case, an attenuation unit is provided in each of the input portion and the output portion of the optical transmission line 300 and the optical transmission line 600 and the transmission signal and the feedback signal are attenuated. The attenuation control unit that determines the attenuation of each of the attenuation unit may also be provided by being integrated with the base station device 100 or the wireless device 200 or may also be provided by being separated from the base station device 100 and the wireless device 200. Furthermore, similarly to the first embodiment and the third embodiment described above, determination of attenuation performed by the attenuation control unit may also be performed such that attenuation that minimizes the ACLR is determined in the adjustment period or may also be performed from the look-up table that stores therein the optimum attenuation according to the average electrical power of the transmission signal.

Furthermore, the attenuation determination process described above in each of the embodiments may also be described as a program that can be executed by a computer. In this case, the program may also be stored in a computer readable recording medium and installed in the computer. Examples of the computer readable recording medium include a portable recording medium, such as a CD-ROM, a DVD disk, a USB memory, and the like or a semiconductor memory, such as a flash memory and the like.

According to an embodiment of the wireless transmission system and the signal transmission method disclosed herein, it is possible to suppress degradation of the quality of signals even if the signals are transmitted by using optical fibers.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A wireless transmission system that includes a first device and a second device that are connected by an optical transmission line, wherein
the first device comprises:
a generator that generates a transmission signal; and
a first attenuator that attenuates the transmission signal generated by the generator and that inputs the transmission signal to the optical transmission line,
the second device comprises:
a second attenuator that attenuates the transmission signal output from the optical transmission line;
an amplifier that amplifies the transmission signal attenuated by the second attenuator;
a transmitter that wirelessly transmits the transmission signal amplified by the amplifier; and
a third attenuator that attenuates a feedback signal that is fed back from the amplifier and that inputs the feedback signal to the optical transmission line,
the first device further includes a fourth attenuator that attenuates the feedback signal that is output from the optical transmission line, and
the first device or the second device further comprises a controller that controls attenuation in each of the first attenuator, the second attenuator, the third attenuator and the fourth attenuator.

2. The wireless transmission system according to claim 1, wherein
the controller includes a calculator that calculates, from the transmission signal amplified by the amplifier, leakage power outside a predetermined transmission frequency band, and
the controller determines pieces of attenuation that are associated with the respective first attenuator and the second attenuator and that minimize the leakage power calculated by the calculator and sets the determined attenuation in the first attenuator and the second attenuator.

3. The wireless transmission system according to claim 2, wherein,
from among combinations of the pieces of the attenuation that are associated with the respective first attenuator and the second attenuator and that have a total sum equal to a predetermined value, the controller determines a combination of pieces of attenuation that minimize the leakage power calculated by the calculator.

4. The wireless transmission system according to claim 1, wherein
the controller includes a calculator that calculates average electrical power of the transmission signal generated by the generator, and
the controller acquires pieces of attenuation that are associated with the respective first attenuator and the second attenuator and that are previously stored in a storing unit by being associated with the average electrical power calculated by the calculator and sets the acquired attenuation in the first attenuator and the second attenuator.

5. The wireless transmission system according to claim 1, wherein
the controller includes a calculator that calculates, from the transmission signal amplified by the amplifier, leakage power outside a predetermined transmission frequency band, and
the controller determines pieces of attenuation that are associated with the respective third attenuator and the fourth attenuator and that minimize the leakage power calculated by the calculator and sets the determined attenuation in the third attenuator and the fourth attenuator.

6. The wireless transmission system according to claim 5, wherein,
from among combinations of the pieces of the attenuation that are associated with the respective third attenuator and the fourth attenuator and that have a total sum equal to a predetermined value, the controller determines a combination of pieces of attenuation that minimize the leakage power calculated by the calculator.

7. The wireless transmission system according to claim 1, wherein
the controller includes a calculator that calculates average electrical power of the feedback signal that is fed back from the amplifier, and
the controller acquires pieces of attenuation that are associated with the respective third attenuator and the fourth attenuator and that are previously stored in a storing unit by being associated with the average electrical power calculated by the calculator and sets the acquired attenuation in the third attenuator and the fourth attenuator.

8. A signal transmission method that is used between devices that are connected by an optical transmission line, the signal transmission method comprising:
setting attenuation in an input unit and in an output unit of the optical transmission line;
acquiring a signal to be transmitted between the devices;
attenuating the acquired signal in the input unit and inputting the attenuated signal to the optical transmission line;
attenuating, in the output unit, the signal that is transmitted by and output from the optical transmission line;
attenuating, in the output unit, a feedback signal to be fed back from the output unit to the input unit and inputting the attenuated feedback signal to the optical transmission line; and attenuating, in the input unit, the feedback signal output from the optical transmission line.

\* \* \* \* \*